United States Patent
Lukens et al.

(10) Patent No.: US 9,829,397 B2
(45) Date of Patent: Nov. 28, 2017

(54) COMPRESSION SEAL FOR FORCE SENSING DEVICE

(71) Applicant: Apple Inc., Cupertino, CA (US)

(72) Inventors: William C. Lukens, Cupertino, CA (US); Brad Boozer, Cupertino, CA (US); Richard D. Shuma, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/090,831

(22) Filed: Apr. 5, 2016

(65) Prior Publication Data
US 2017/0089773 A1    Mar. 30, 2017

Related U.S. Application Data

(60) Provisional application No. 62/233,961, filed on Sep. 28, 2015.

(51) Int. Cl.
| | |
|---|---|
| *G01L 1/24* | (2006.01) |
| *G01L 1/14* | (2006.01) |
| *H01L 41/113* | (2006.01) |
| *H01L 41/053* | (2006.01) |
| *G01L 1/16* | (2006.01) |

(52) U.S. Cl.
CPC ............... *G01L 1/142* (2013.01); *G01L 1/16* (2013.01); *H01L 41/053* (2013.01); *H01L 41/1132* (2013.01)

(58) Field of Classification Search
CPC ......... G01L 1/142; G01L 1/16; H01L 41/053; H01L 41/1132; H05K 5/03; H05K 5/061; H05K 5/068

USPC .................... 73/760, 781, 862.626
See application file for complete search history.

(56) References Cited

U.S. PATENT DOCUMENTS

| | | | | |
|---|---|---|---|---|
| 3,750,127 A | * | 7/1973 | Ayers ..................... | G01K 1/024 174/110 R |
| 4,575,917 A | * | 3/1986 | Kana ...................... | B23P 19/08 277/609 |
| 4,754,645 A | * | 7/1988 | Piche .................... | G01N 29/032 73/597 |
| 5,831,170 A | | 11/1998 | Sokn | |
| 6,250,863 B1 | | 6/2001 | Kamentser et al. | |
| 8,698,777 B2 | | 4/2014 | Endo et al. | |
| 2002/0043510 A1 | * | 4/2002 | Bachman .................. | B66C 1/34 212/283 |
| 2005/0122714 A1 | * | 6/2005 | Matthews ............... | F21L 4/027 362/206 |

(Continued)

*Primary Examiner* — Max Noori
(74) *Attorney, Agent, or Firm* — Brownstein Hyatt Farber Schreck, LLP

(57) ABSTRACT

An electronic device includes a seal compressed between a moveable structure and a support. A retainer maintains seal compression in a first direction absent force exerted on the moveable structure. However, the retainer allows increased seal compression by moving in a second, opposing direction when force is exerted on the moveable structure. A force sensor (positioned internal to the seal) is influenced by movement of the moveable structure in response to the force and a signal received from the force sensor indicates an amount of the force. By maintaining the seal in compression but allowing further compression, the seal can hermetically seal the electronic device against contaminant entry without adversely impacting detection of the amount of force.

20 Claims, 6 Drawing Sheets

(56) References Cited

U.S. PATENT DOCUMENTS

| | | | |
|---|---|---|---|
| 2008/0202251 A1* | 8/2008 | Serban | G01L 1/142 73/780 |
| 2010/0108151 A1* | 5/2010 | Duelli | F16K 3/18 137/14 |
| 2014/0333035 A1 | 11/2014 | Schemmann et al. | |

* cited by examiner

COMPRESSION SEAL FOR FORCE SENSING DEVICE

CROSS-REFERENCE TO RELATED APPLICATION

This application claims the benefit under 35 U.S.C. §119 (e) of U.S. Provisional Patent Application No. 62/233,961, filed Sep. 28, 2015, and entitled "Compression Seal for Force Sensing Device," the contents of which are incorporated by reference as if fully disclosed herein.

FIELD

The described embodiments relate generally to force sensing. More particularly, the present embodiments relate to a compression sealed interface for a force sensing device.

BACKGROUND

There are many different kinds of electronic devices such as desktop computing devices, laptop computing devices, tablet computing devices, mobile computing devices, smart phones, wearable electronic devices, digital media players, displays, and so on. Many electronic devices include mechanisms that are operable to receive input from a user. Operation of the electronic device may be controlled or changed based on received input.

For example, some electronic devices include touch surfaces such as touch screens, buttons, and so on. Sensors included in the electronic device may be operable to detect when a user touches the touch surface. This touch, or various characteristics thereof, may be interpreted by the electronic device as input.

Many touch surfaces may be separate components from a housing of the electronic device. As such, contaminants such as water or other liquids, dust, dirt, and so on may be able to enter into an internal volume of the electronic device from an exterior environment in areas between touch surfaces and the housing. Various components of the electronic device may be vulnerable to such contaminants. In some electronic device, various components may be positioned in such areas to seal the electronic device against contaminant entry.

SUMMARY

The present disclosure relates to a compression seal for a force sensing device. An electronic device includes a force sensor disposed between a housing or other support and a cover glass or other moveable structure. The force sensor is operable to detect deflection of the cover glass caused by force exerted on the cover glass. The electronic device also includes a gasket or other seal compressed between the cover glass and the force sensor. A retainer maintains compression of the gasket while allowing additional compression related to the deflection of the cover glass. In this way, the gasket may hermetically seal the electronic device without adversely impacting operation of the force sensor.

In various embodiments, a force sensing device includes a housing, a cover, a gasket compressed between the housing and the cover, a retainer that maintains compression of the gasket absent a force exerted on the cover and that is operable to allow increased compression of the gasket when the force is exerted on the cover, and a force sensor disposed between the housing and the cover that produces a signal indicative of an amount of the force. The gasket is positioned between the force sensor and an exterior environment. The gasket may form a hermetic seal.

In some examples, the force sensor includes a pair of capacitive plates separated by a deformable spacer material. The deformable spacer material may be softer than the gasket. The deformable spacer material may be a foam. In other examples, the force sensor includes a piezoelectric material.

In various examples, the housing includes a shelf and the retainer includes a lip. In such examples, the lip is operable to engage the shelf absent the force to restrict expansion of the gasket.

In numerous embodiments, a force sensing electronic device includes a support, an input surface, an o-ring preloaded in compression between the support and the input surface, a clamp, and a force sensor disposed between the support and the input surface. The clamp resists expansion of the o-ring in a first direction absent a force exerted on the input surface and moves in a second direction opposite to the first direction when the force is exerted on the input surface. The force sensor is disposed between the support and the input surface that produces a signal indicative of an amount of displacement between the input surface and the support caused by the force. The force sensor is positioned proximate to the o-ring in a third direction perpendicular to the first direction.

In various examples, a dimension of the o-ring between the support and the input surface is different than a dimension of the force sensor between the support and the input surface. In numerous examples, the amount of displacement between the input surface and the support caused by the force depends on a resistance of the o-ring and the force sensor.

In some examples, the clamp is fixed to the input surface and moves with respect to the support in the second direction. In other examples, the clamp is fixed to the support and moves with respect to the input surface in the second direction. The clamp may be positioned between the o-ring and the input surface and between the force sensor and the input surface.

In various examples, the o-ring is formed of a first type of silicone and the force sensor includes a second type of silicone. The second type of silicone may have a lower durometer than the first type of silicone.

In various embodiments, an electronic device includes a base, a moveable structure, a compressed seal positioned between the base and the moveable structure, a restraint that maintains compression of the seal absent a force exerted on the moveable structure and allows movement of the moveable structure relative to the base in response to the force, a strain gauge that experiences a strain related to the movement, and a processing unit that receives a signal indicative of an amount of the force from the strain gauge. The strain for the amount of the force is dependent upon a resistance of the compressed seal to the movement.

In some examples, the strain gauge is coupled to a portion of the restraint that deflects absent the force and the strain decreases as the amount of the force increases. In other examples, the electronic device further includes a strut positioned between the base and the moveable structure that flexes in response to the movement. In such examples, the strain gauge is coupled to the strut.

In various examples, the restraint blocks entry of contaminants that breach the compressed seal. In some examples, the compressed seal forms a continuous outer perimeter around the strain gauge and the strain gauge does not form a continuous inner perimeter within the outer perimeter. In numerous examples, the compressed seal does not stiffen in response to the movement.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The description that follows includes sample systems, methods, and apparatuses that embody various elements of the present disclosure. However, it should be understood that the described disclosure may be practiced in a variety of forms in addition to those described herein.

The following disclosure relates to a compression seal for a force sensing device. An electronic device includes a seal compressed between a moveable structure and a support. A retainer maintains seal compression in a first direction absent force exerted on the moveable structure. However, the retainer allows increased seal compression by moving in a second, opposing direction when force is exerted on the moveable structure. A force sensor (positioned internal to the seal) is influenced by movement of the moveable structure in response to the force and a signal received from the force sensor indicates an amount of the force. By maintaining the seal in compression but allowing further compression, the seal can hermetically seal the electronic device against contaminant entry without adversely impacting detection of the amount of force.

This configuration of the seal and the force sensor decouples sealing of the electronic device from the force sensor. By having the seal separate, and in some implementations providing at least a portion of the resistance to applied force utilized in force sensor operation, a wider variety of materials that may be used in the force sensor over electronic device that use a force sensor as a seal. Further, this may allow a wider variety of other force sensor parameters, such as force sensor dimensions.

These and other embodiments are discussed below with reference to FIGS. 1-6. However, those skilled in the art will readily appreciate that the detailed description given herein with respect to these Figures is for explanatory purposes only and should not be construed as limiting.

Figure 1:
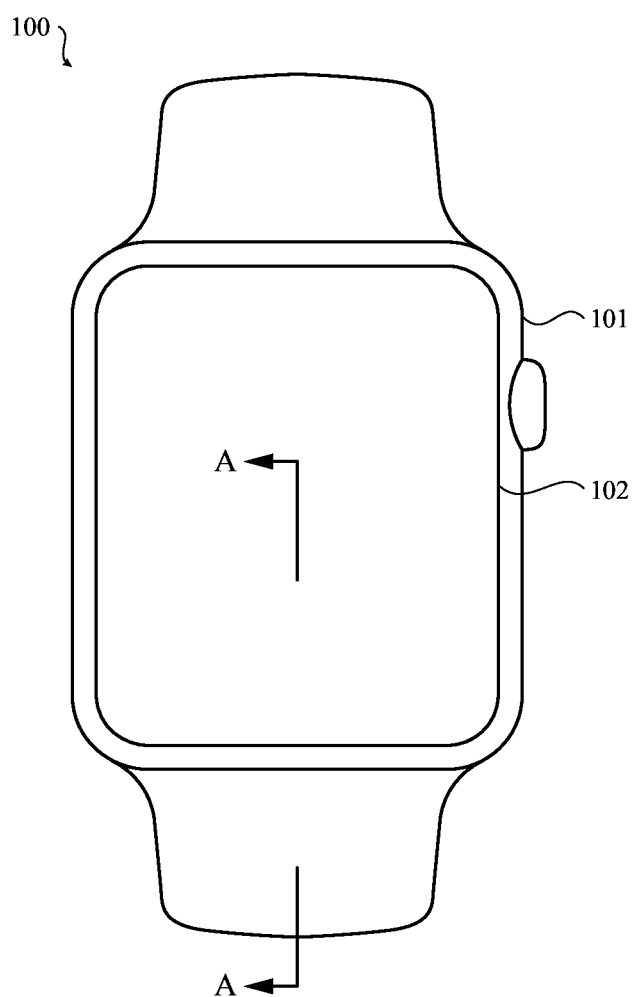
FIG. 1 depicts an electronic device including a compression seal for a force sensing device.

FIG. 1 depicts an electronic device 100 including a compression seal for a force sensing device, which is described in detail with respect to FIG. 2A below. The electronic device 100 may include a housing 101, base, or support and a cover glass 102, input surface, or moveable structure. The electronic device 100 may be operable to receive input via a user exerting force on the cover glass 102.

Figure 2A:
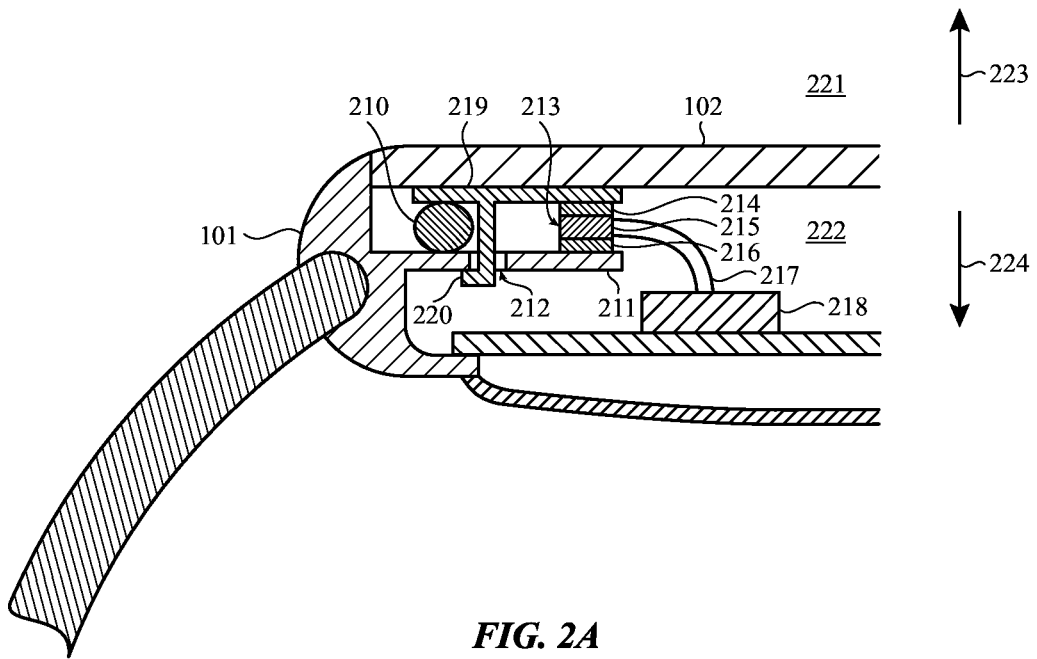
FIG. 2A depicts first example partial cross-sectional view of the electronic device of FIG. 1, taken along line A-A of FIG. 1.

FIG. 2A depicts first example partial cross-sectional view of the electronic device 100 of FIG. 1, taken along line A-A of FIG. 1. A gasket 210 (also encompassing a seal or an o-ring) and a force sensor 213 may be disposed within an internal volume 222 of the electronic device 100. The gasket 210 and the force sensor 213 or force sensing device may be positioned between a shelf 211 of the housing 101 and the cover glass 102. The gasket 210 may be positioned between the force sensor 213 and an exterior environment around the electronic device 100. A retainer 219 (also encompassing a clamp, a restraint, or a retaining element) may be positioned between the gasket 210 and the cover glass 102, as well as between the force sensor 213 and the cover glass 102.

As shown in FIG. 2A, the gasket 210 may be compressed absent force exerted on the cover glass 102. Compression of the gasket 210 may energize the gasket 210 and allow the gasket 210 to provide a better seal than if uncompressed. The seal may be a hermetic seal, protecting the force sensor 213 and/or other components of the electronic device 100 in extreme environments such as submersion at high pressures, exposure to chemicals, and so on. The gasket 210 may be preloaded in compression between the shelf 211 and the cover glass 102 by the retainer 219. The retainer 219 may maintain compression of the compressed gasket 210 absent force exerted on the cover glass 102.

The retainer 219 may maintain compression of the gasket 210 via an L-shaped structure 220 (also encompassing a lip) or other engagement mechanism. The L-shaped structure 220 may extend through an aperture 212 in the shelf 211 and engage the shelf 211 to restrict and/or not allow the gasket 210 to expand or uncompress. The L-shaped structure 220 may not allow the gasket 210 to uncompress by engaging the shelf 211 to resist movement in a first direction 223. However, the retainer 219 may allow further compression of the gasket 210 in a second direction 224, opposite the first direction 223.

Figure 2B:
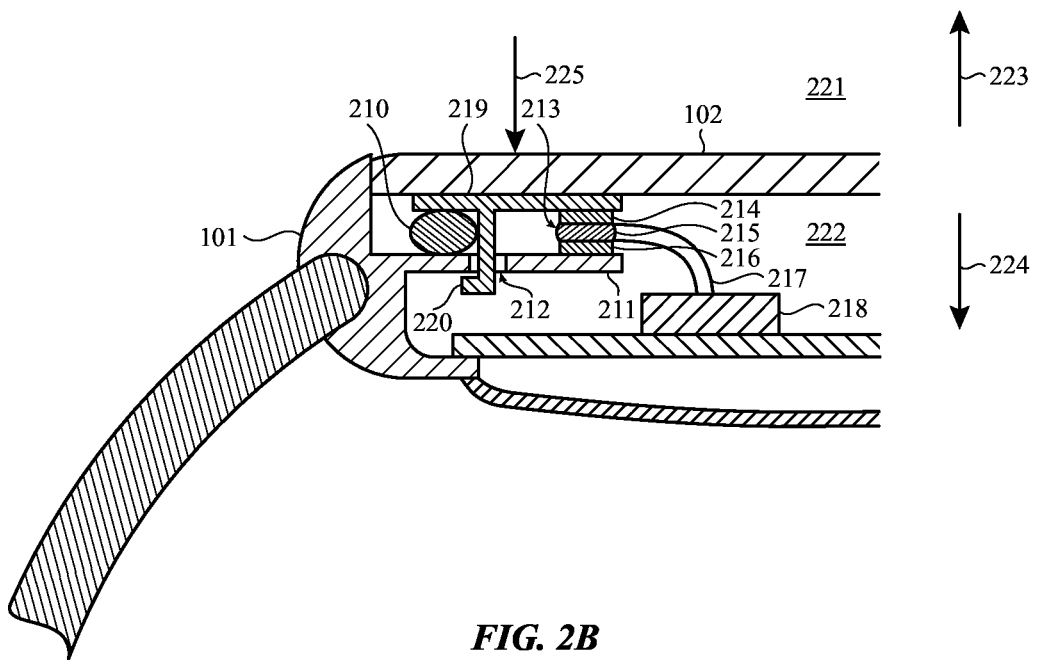
FIG. 2B depicts the view of FIG. 2A when a force is exerted on the cover glass.

FIG. 2B depicts the view of FIG. 2A when a force 225 is exerted on the cover glass 102. In response to the force 225, the cover glass 102 may deflect with respect to the shelf 211 in the second direction 224. The retainer 219 may more or translate (by the L-shaped portion moving in the aperture 212) to transfer the force 225 to the gasket 210. This may further compress the gasket 210. The retainer 219 may also transfer the force 225 to the force sensor 213.

The force sensor 213 may be coupled to a processing unit 218 via a flex circuit 217 and/or other electrical connection. The processing unit 218 may receive one or more signals produced by and/or from the force sensor 213 indicating an amount of displacement (and thus the force 225) between the cover glass 102 and the shelf 211 caused by the force 225. The processing unit 218 may correlate the signal to determine the force 225. The processing unit 218 may determine the force 225 to be an amount of force within a range as opposed to whether or not the force 225 is exerted on the cover glass 102, though in various implementations the processing unit 218 may determine whether or not the force 225 is exerted rather than an amount of the force 225.

For example, in this implementation, the force sensor 213 may include first and second capacitive plates 214 and 216 separated by a deformable spacer material 215. The first and second capacitive plates 214 and 216 may form a capacitor. The capacitance of a capacitor formed by the first and second capacitive plates 214 and 216 may vary based on the deflection of the first and second capacitive plates 214 and 216 with respect to each other, which in turn varies based on the deflection of the cover glass 102 and thus the force 225. The signals received by the processing unit 218 may indicate a capacitance of that capacitor. The capacitance may be correlated by the processing unit 218 (such as by comparison to values in a lookup table stored in a non-transitory storage media of the electronic device 100) to determine an amount of the force 225.

As illustrated, the gasket 210 and the force sensor 213 may be positioned between the shelf 211 and the cover glass 102 such that neither is positioned between the other and either the shelf 211 or the cover glass 102. Thus, the implementation illustrated in FIGS. 2A-2B decouples sealing and force sensing. Further, as displacement of the cover glass 102 by the force 225 causes compression of both the gasket 210 and the force sensor 213 (or the deformable spacer material 215), the amount of displacement may be dependent on the resistance of the gasket 210 and the force sensor 213.

Figure 2C:
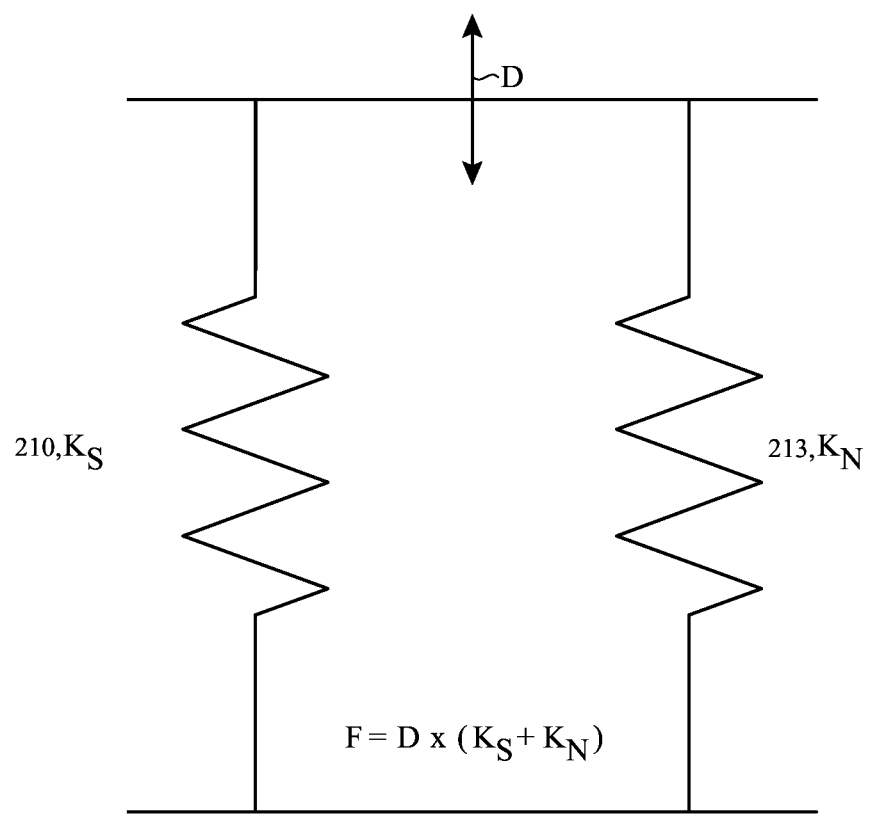
FIG. 2C depicts a simplified mechanical schematic illustrating the displacement of the cover glass shown in FIGS. 2A-2B in relation to compression of the gasket and the force sensor.

For example, FIG. 2C depicts a simplified mechanical schematic illustrating the displacement of the cover glass 102 shown in FIGS. 2A-2B in relation to compression of the gasket 210 and the force sensor 213. The displacement is represented by D, the mechanical compression of the gasket 210 is represented by Ks, and the mechanical compression of the force sensor 213 is represented by Kn. Thus, the amount of the force 225 is D times the sum of Ks and Kn.

Returning to FIGS. 2A-2B, the dependence of the amount of displacement of the cover glass 102 on the resistance of the gasket 210 and the force sensor 213 may allow a wider variety of materials to be used for the deformable spacer material 215 without adversely impacting performance of the force sensor 213. For example, a harder (or harder durometer) material may be used for the gasket 210 and a softer (or lower durometer) material may be used for the deformable spacer material 215. In some implementations, different materials may be used for the gasket 210 and the deformable spacer material 215. However, in other implementations, harder and softer forms of a same or similar material may be used.

For example, in various implementations, the gasket 210 and the deformable spacer material 215 may both be formed of silicone. In other words, the gasket 210 may be formed of a first type of silicone and the deformable spacer material 215 may be formed of a second type of silicone. In such an implementation, the gasket 210 may be formed of a harder silicone and the deformable spacer material 215 may be formed of a softer silicone. In some cases, the gasket 210 may be formed of a solid silicone and the deformable spacer material 215 may be formed of a silicone foam.

Regardless of the particular materials used for the gasket 210 and/or the deformable spacer material 215, the gasket 210 may be formed of a material that does not significantly stiffen or compression set significantly beyond the preload absent the force 225. Forming the gasket 210 of a material that significantly stiffens or compression sets significantly beyond the preload could affect the amount of the displacement of the cover glass 102 in response to the force 225, making the force curve uneven and/or making measurements based on the force sensor 213 inaccurate. Forming the gasket 210 of a material that does not significantly stiffen or compression set significantly beyond the preload prevents these potential issues.

The retainer 219 is shown as fixed to the cover glass 102 (such as by adhesive, by being integrally formed with the cover glass 102, and so on) and operable to move or translate in the second direction 224 with respect to the shelf 211 and/or housing 101. However, it is understood that this is an example. In other implementations, the retainer 219 may be fixed to the shelf 211 and/or housing 101 and may be operable to move or translate in the second direction 224 with respect to the cover glass 102 without departing from the scope of the present disclosure.

As shown, portions of the retainer 219 (such as the L-shaped structure 220) may be positioned between the force sensor 213 or other components of the electronic device 100 and the external environment 221. As such, the retainer 219 may also function as a seal and block entry of contaminants into the internal volume 222, particularly if the contaminants breach the gasket 210.

The gasket 210 may form a continuous perimeter around the internal volume 222. The force sensor 213 may be positioned within the perimeter formed by the gasket 210. In some implementations, the force sensor 213 may form a continuous inner perimeter within a continuous outer perimeter formed by the gasket 210. However, in other implementations, the force sensor 213 may not be continuous within an inner perimeter of a gasket 210 outer perimeter. In some examples, multiple discontinuous force sensors 213 may be positioned within a continuous perimeter formed by the gasket 210.

Although the force sensor 213 is illustrated and described above with respect to FIGS. 2A-2B as having a particular configuration of components, it is understood that this is an example. In various implementations, a variety of different force sensors may be used without departing from the scope of the present disclosure. For example, FIG. 3 depicts a second example partial cross-sectional view of the electronic device 100 of FIG. 1 in accordance with further embodiments.

Figure 3:
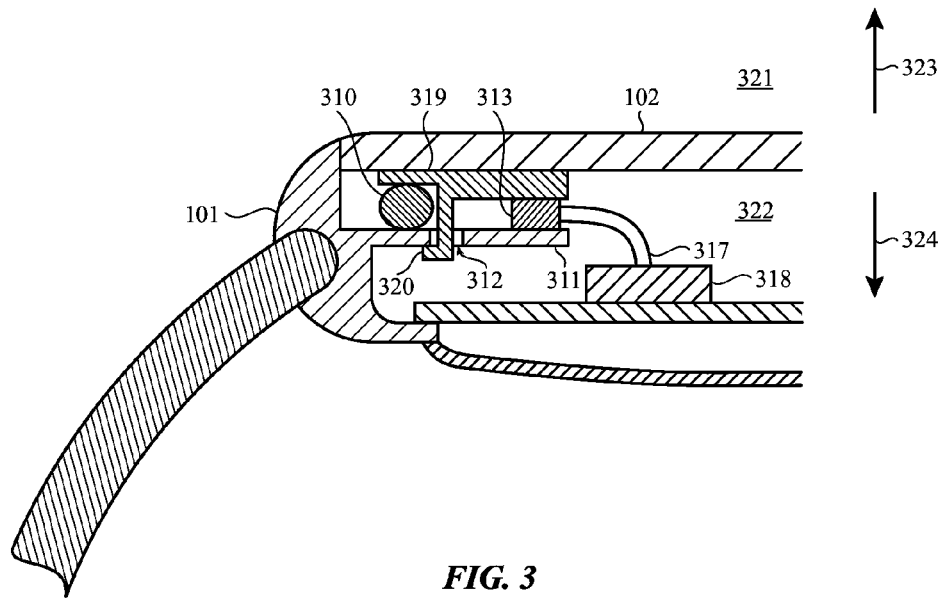
FIG. 3 depicts a second example partial cross-sectional view of the electronic device of FIG. 1 in accordance with further embodiments.

In the implementation illustrated in FIG. 3, the force sensor 313 may formed of a piezoelectric material rather than the first and second capacitive plates 214 and 216 separated by the deformable spacer material 215. Compression of the piezoelectric material by exertion of force on the cover glass 102 may cause the force sensor 313 to transmit signals to the processing unit 318 via the flex circuit 317. The processing unit 318 may analyze the signals to determine the amount of force exerted on the cover glass 102.

Further, as sealing and force sensing are decoupled, a wider variety of force sensor 313 dimensions may be possible. In this implementation, the force sensor 313 may have a smaller height than the gasket 310. The retainer 319 may be thinner where it contacts the gasket 310 than where it contacts the force sensor 313 so that the gasket 310 and the force sensor 313 are compressed when the cover glass 102 deflects under the exertion of force.

Figure 4:
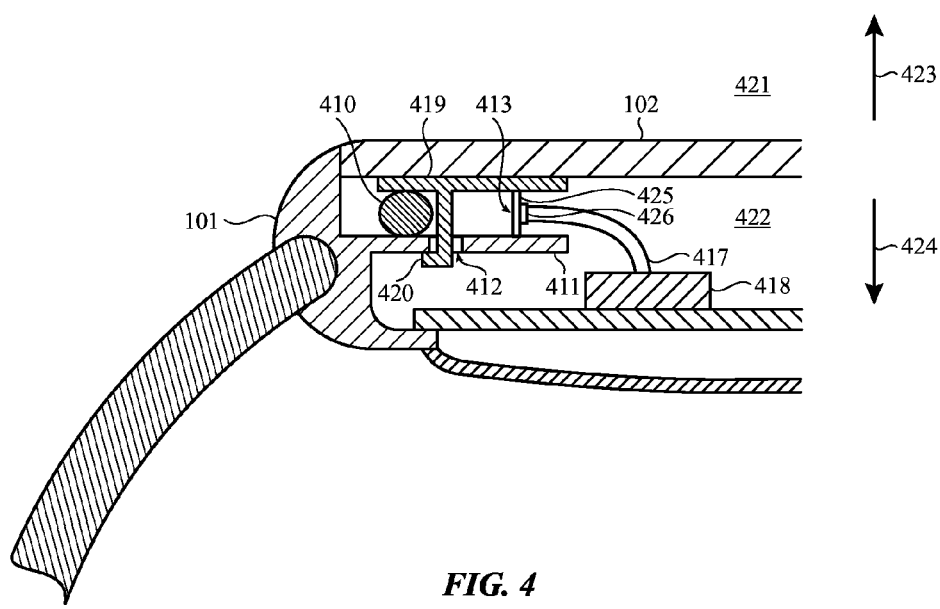
FIG. 4 depicts a third example partial cross-sectional view of the electronic device of FIG. 1 in accordance with further embodiments.

By way of another example, in various implementations, strain gauges may be used. FIG. 4 depicts a third example partial cross-sectional view of the electronic device 100 of FIG. 1 in accordance with further embodiments. In the implementation illustrated in FIG. 4, the force sensor 413 may include a strain gauge 426 mounted on a strut 425 positioned between the shelf 411 and the cover glass 102. The strut 425 may flex in response to movement or deflection of the cover glass 102. This flexing may cause a strain that is experienced by the strain gauge 426. The processing unit 418 may receive signals from the strain gauge 426 via the flex circuit 417 indicating the experienced strain and may correlate the signals to determine an amount of force exerted on the cover glass 102.

Like the force transferred to the force sensors 213 and 313 of the implementations shown in FIGS. 2A-2B and 3, the strain experienced by the strain gauge 426 may be dependent upon the resistance of the gasket 410 to deflection of the cover glass 102 in the direction 424. The more the gasket 410 resists a particular force, the less the cover glass 102 deflects in the direction 424 and thus the less strain experienced by the strain gauge 426.

However, though FIG. 4 illustrates the strain gauge 426 mounted on the moveable strut 425 positioned between the shelf 411 and the cover glass 102 where the strain experienced by the strain gauge 426 is proportional to force exerted on the cover glass 102, it is understood that this is an example. In other implementations, strain gauges may be otherwise disposed without departing from the scope of the present disclosure.

Figure 5:
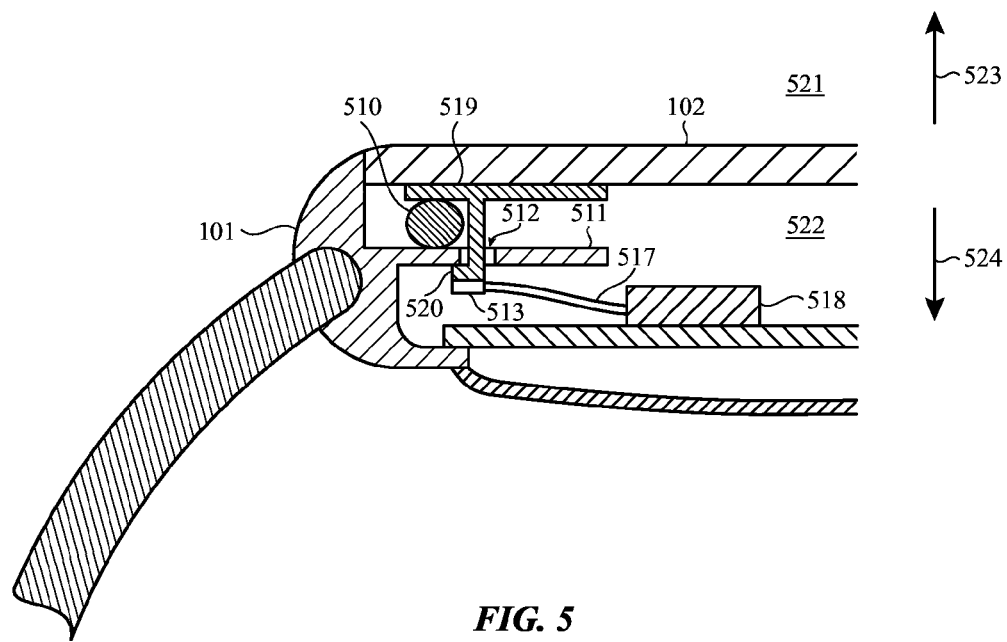
FIG. 5 depicts a fourth example partial cross-sectional view of the electronic device of FIG. 1 in accordance with further embodiments.

For example, FIG. 5 depicts a fourth example partial cross-sectional view of the electronic device 100 of FIG. 1 in accordance with further embodiments. In FIG. 5, the force sensor 513 may include a strain gauge disposed on a lip portion of the L-shaped structure 520. Absent force exerted on the cover glass 102, the lip portion of the L-shaped structure 520 may engage the shelf 511 and may be deflected by the compression of the gasket 510 exerting force on the retainer 519 in the direction 523. This deflection may cause strain, which may be experienced by the strain gauge of the force sensor 513. When force is exerted on the cover glass 102, the retainer 519 may translate or move in the direction 524, lessening or eliminating the deflection. In other words, the strain decreases as the amount of force increases. As a result, the strain gauge of the force sensor 513 may experience less strain. Thus, the strain experienced by the strain gauge of the force sensor 513 may be inversely proportional to force exerted on the cover glass 102.

The processing unit 518 may receive signals from the strain gauge of the force sensor 513 via the flex circuit 517 indicating the experienced strain. The processing unit 518 may correlate the signals to determine an amount of force exerted on the cover glass 102 based on the strain. The processing unit 518 may correlate lower strains with higher exerted amounts of force and higher strains with lower exerted amounts of force and/or the absence of exerted force.

Although FIGS. 1-5 illustrate the electronic device 100 as a wearable electronic device, it is understood that this is an example. In various implementations, a compression seal for a force sensing device may be used in a variety of different electronic devices (also encompassing a force sensing electronic device) without departing from the scope of the present disclosure. These may include laptop computing devices, desktop computing devices, fitness monitors, mobile computing devices, tablet computing devices, smart phones, displays, digital media players, keyboards, and so on.

Figure 6:
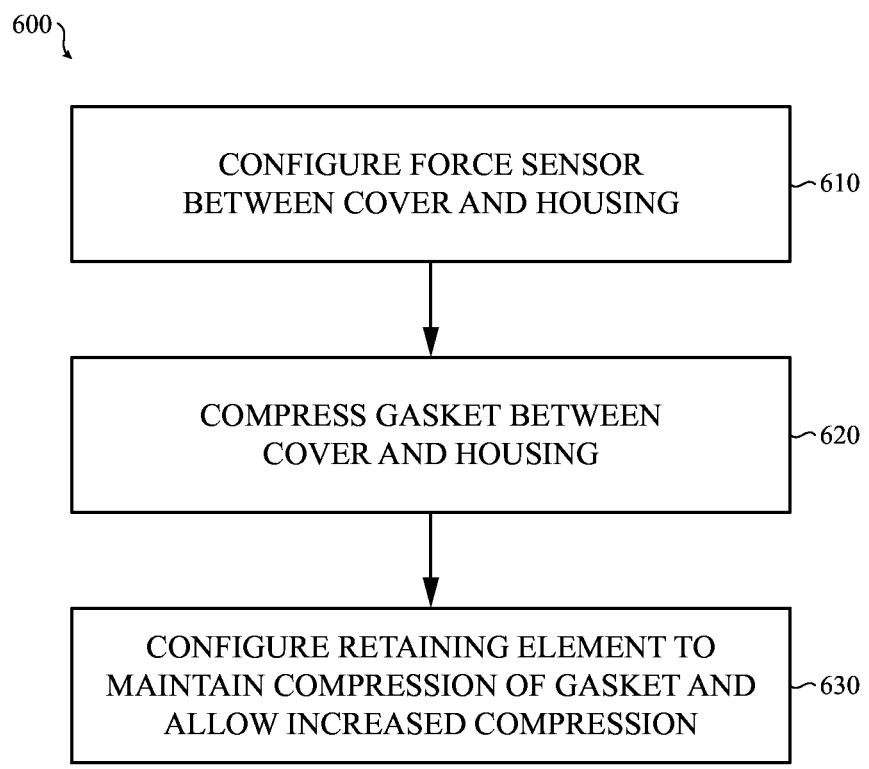
FIG. 6 is a flow chart illustrating a method for constructing a compression seal for a force sensing device. This method may be performed as part of manufacturing one or more of the electronic devices of FIGS. 1-5.

FIG. 6 is a flow chart illustrating a method 600 constructing a compression seal for a force sensing device. This method may be performed as part of manufacturing one or more of the electronic devices of FIGS. 1-5.

At 610, a force sensor may be configured between a cover or other moveable structure and a housing. The force sensor may be configured to obtain measurements related to force exerted on the cover. The measurements may be analyzed by a processing unit to determine and amount of the exerted force.

In 620, a gasket may be compressed between the cover and the housing. The gasket may be positioned between the force sensor and an external environment. The gasket may form a hermetic seal. The gasket may be disposed proximate (e.g., adjacent and/or other components and/or gaps may be positioned in between) to the force sensor in a direction approximately perpendicular to the direction in which the gasket and force sensor are positioned between the cover and the housing. The gasket may be compressed by a retaining element. Such a retaining element may oppose expansion or release of the gasket compression by engaging the cover, the housing, and/or other such structures.

At 630, the retaining element may be configured to maintain compression of the gasket and allow increased compression. The retaining element may be configured to allow increased compression by being operable to move in a first direction corresponding to increased compression of the gasket. The retaining element may be configured to maintain compression by being restricted from moving in a second direction corresponding to decreased compression of the gasket.

Although the example method 600 is illustrated and described as including particular operations performed in a particular order, it is understood that this is an example. In various implementations, various orders of the same, similar, and/or different operations may be performed without departing from the scope of the present disclosure.

For example, the method 600 illustrates and describes 620 and 630 as separate, linearly performed operations. However, it is understood that this is an example for the purposes of clarity. In various implementations, 620 and 630 may be performed simultaneously without departing from the scope of the present disclosure. For example, configuring the gasket to maintain compression may also compress the gasket.

As described above and illustrated in the accompanying figures, the present disclosure relates to a compression seal for a force sensing device. An electronic device includes a seal compressed between a moveable structure and a support. A retainer maintains seal compression in a first direction absent of force exerted on the moveable structure. However, the retainer allows increased seal compression by moving in a second, opposing direction when force is exerted on the moveable structure. A force sensor (positioned internal to the seal) is influenced by movement of the moveable structure in response to the force and a signal received from the force sensor indicates an amount of the force. By maintaining the seal in compression but allowing further compression, the seal can hermetically seal the electronic device against contaminant entry without adversely impacting detection of the amount of force. This configuration of the seal and the force sensor decouples sealing of the electronic device from the force sensor. By having the seal separate, a wider variety of materials that may be used in the force sensor over electronic device that use a force sensor as a seal. Further, this may allow a wider variety of other force sensor parameters, such as force sensor dimensions.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A force sensing device, comprising:
    a housing;
    a cover;
    a gasket compressed between the housing and the cover;
    a retainer that binds the gasket to maintain compression of the gasket absent a force exerted on the cover and is operable to allow increased compression of the gasket when the force is exerted on the cover; and
    a force sensor disposed between the housing and the cover that produces a signal indicative of an amount of the force;
    wherein the gasket is positioned between the force sensor and an exterior environment.

2. The force sensing device of claim 1, wherein the gasket forms a hermetic seal.

3. The force sensing device of claim 1, wherein the force sensor comprises a pair of capacitive plates separated by a deformable spacer material.

4. The force sensing device of claim 3, wherein the deformable spacer material is softer than the gasket.

5. The force sensing device of claim 3, wherein the deformable spacer material comprises a foam.

6. The force sensing device of claim 1, wherein the force sensor comprises a piezoelectric material.

7. The force sensing device of claim 1, wherein:
    the housing includes a shelf;
    the retainer includes a lip;
    the lip is operable to engage the shelf absent the force to restrict expansion of the gasket.

8. A force sensing electronic device, comprising:
    a support;
    an input surface;
    an o-ring preloaded in compression between the support and the input surface;
    a clamp that:
        resists expansion of the o-ring in a first direction absent a force exerted on the input surface; and
        moves in a second direction opposite to the first direction when the force is exerted on the input surface; and
    a force sensor disposed between the support and the input surface that produces a signal indicative of an amount of displacement between the input surface and the support caused by the force, the force sensor positioned proximate to the o-ring in a third direction perpendicular to the first direction.

9. The force sensing electronic device of claim 8, wherein a dimension of the o-ring between the support and the input surface is different than a dimension of the force sensor between the support and the input surface.

10. The force sensing electronic device of claim 8, wherein the amount of displacement between the input surface and the support caused by the force depends on a resistance of the o-ring and the force sensor.

11. The force sensing electronic device of claim 8, wherein the clamp is fixed to the input surface and moves with respect to the support in the second direction.

12. The force sensing electronic device of claim 8, wherein the clamp is fixed to the support and moves with respect to the input surface in the second direction.

13. The force sensing electronic device of claim 8, wherein:
    the o-ring is formed of a first type of silicone; and
    the force sensor includes a second type of silicone having a lower durometer than the first type of silicone.

14. The force sensing electronic device of claim 8, wherein the clamp is positioned between the o-ring and the input surface and between the force sensor and the input surface.

15. An electronic device, comprising:
    a base;
    a moveable structure;
    a compressed seal positioned between the base and the moveable structure;
    a restraint that restricts the seal to maintain compression of the seal absent a force exerted on the moveable structure and allow movement of the moveable structure relative to the base in response to the force;
    a strain gauge that experiences a strain related to the movement;
    a processing unit that receives a signal indicative of an amount of the force from the strain gauge; and
    wherein the strain for the amount of the force is dependent upon a resistance of the compressed seal to the movement.

16. The electronic device of claim 15, wherein:
    the strain gauge is coupled to a portion of the restraint that deflects absent the force; and
    the strain decreases as the amount of the force increases.

17. The electronic device of claim 15, further comprising a strut positioned between the base and the moveable structure that flexes in response to the movement wherein: the strain gauge is coupled to the strut.

18. The electronic device of claim 15, wherein the restraint blocks entry of contaminants that breach the compressed seal.

19. The electronic device of claim 15, wherein:
    the compressed seal forms a continuous outer perimeter around the strain gauge; and
    the strain gauge does not form a continuous inner perimeter within the outer perimeter.

20. The electronic device of claim 15, wherein the compressed seal does not stiffen in response to the movement.

* * * * *